United States Patent [19]
Hartwell et al.

[11] 4,164,041
[45] Aug. 7, 1979

[54] MEMORY ORGANIZATION TO DISTRIBUTE POWER DISSIPATION AND TO ALLOW SINGLE CIRCUIT PACK MEMORY GROWTH

[75] Inventors: Walter T. Hartwell, St. Charles, Ill.; David L. Hinshaw, Longwood, Fla.; Charles W. Hoffner, II, Naperville; Wing N. Toy, Glen Ellyn, both of Ill.

[73] Assignee: Bell Telephone Laboratories, Incorporated, Murray Hill, N.J.

[21] Appl. No.: 762,837

[22] Filed: Jan. 27, 1977

[51] Int. Cl.² ............. G11C 21/00; G11C 13/00
[52] U.S. Cl. ........................ 365/238; 365/200; 365/77
[58] Field of Search ...... 340/173 R, 173 BB, 173 RC; 365/238, 233, 200, 73, 75, 76, 77

[56] References Cited
U.S. PATENT DOCUMENTS

| | | | |
|---|---|---|---|
| 3,766,534 | 10/1973 | Beausoleil | 365/238 |
| 3,772,658 | 11/1973 | Sarlo | 365/238 |
| 3,893,088 | 1/1975 | Bell | 365/238 |
| 3,975,717 | 8/1976 | Panigrahi | 340/173 R |
| 4,007,452 | 2/1977 | Hoff, Jr. | 340/173 R |

Primary Examiner—Terrell W. Fears
Attorney, Agent, or Firm—Peter Visserman

[57] ABSTRACT

A word organized random access memory comprises a plurality of circuit packs arranged such that the memory capacity can be easily increased or decreased in increments corresponding to the word capacity of a single circuit pack while distributing the power dissipation associated with accessing a word across a plurality of the circuit packs. Each circuit pack comprises two or more independently accessible memory modules with each module arranged to store a plurality of word segments each of which comprises corresponding segments of different memory words. Input, output, and control wiring is provided such that access control of the circuit packs associates the packs into a chain which is looped back on itself. Links of this chain comprise groups of modules which define memory word locations wherein no two modules of a group are packaged on the same circuit pack. Loop around connections complete groups by interconnecting incomplete groups from the end of the chain with complementary incomplete groups from the beginning of the chain. The capacity of the memory is increased or decreased by adding or deleting one or more circuit packs in the chain. Switches are provided to accommodate the insertion or deletion of a circuit pack.

9 Claims, 2 Drawing Figures

MEMORY ORGANIZATION TO DISTRIBUTE POWER DISSIPATION AND TO ALLOW SINGLE CIRCUIT PACK MEMORY GROWTH

FIELD OF THE INVENTION

Our invention relates to physical memory organizations and more particularly to an organization which permits memory growth in single circuit pack increments while distributing power dissipation among the circuit packs of the memory.

BACKGROUND OF THE INVENTION

Semiconductor memory systems comprise a plurality of circuit packs wherein each circuit pack comprises a plurality of individual semiconductor memory chips. Power dissipation within the memory chips generates heat and constrains the packing density of the chips on the circuit packs. It is known that packing density can be increased by distributing power dissipation within a memory system to avoid heat build-up concentrations. One well-known example is to organize memory chips on a circuit pack such that consecutive memory addresses select different memory chips, thus distributing power dissipation over the circuit pack.

In another prior art arrangement, distribution of power dissipation among circuit packs of a memory system is accomplished by organizing the system into a bit-sliced arrangement. In a bit-sliced memory system, each circuit pack provides a defined segment of a memory word. Accordingly, a small number of memory chips are activated on a plurality of circuit packs rather than concentrating the activated memory chips on a single circuit pack. However, bit-sliced memory systems restrict memory growth to relatively large-size growth units. The minimum bit-sliced memory growth unit is a plurality of circuit packs which are required to define a total memory word. Accordingly, in prior art arrangements, memory chips which comprise a memory word are packaged on a single circuit pack concentrating power dissipation but allowing single circuit pack growth units; or the memory chips which comprise a memory word are distributed among the memory circuit packs, thus distributing the power dissipation among the circuit packs of the memory but requiring relatively large-size minimum growth units.

SUMMARY OF THE INVENTION

In accordance with our invention, a word organized random access memory comprises a plurality of circuit packs wherein each circuit pack comprises two or more independently accessible memory modules which each stores a corresponding word segment of a plurality of memory words; and circuit pack interconnections which associate modules into groups of modules defining memory words such that no two modules of a group are on the same circuit pack. Accordingly, in broad context where there are n bits in each memory word, we provide x modules in a group where x is greater than one but less than or equal to n. These groups form interleaved links of a chain of the circuit packs and incomplete groups of modules from the end of the chain are connected back to the complementary incomplete groups at the beginning of the chain to form the closed chain structure.

Advantageously, our memory system arrangement can be expanded or contracted in single circuit pack increments and power dissipation associated with accessing a word is distributed among a plurality of circuit packs.

In accordance with one aspect of our invention, a maximum-sized memory is initially wired and switches are provided to accommodate any number of memory circuit packs from one to the maximum number.

BRIEF DESCRIPTION OF THE DRAWING

The invention will be understood from the following detailed description when read with reference to the drawing in which.

DETAILED DESCRIPTION

Figure 1:
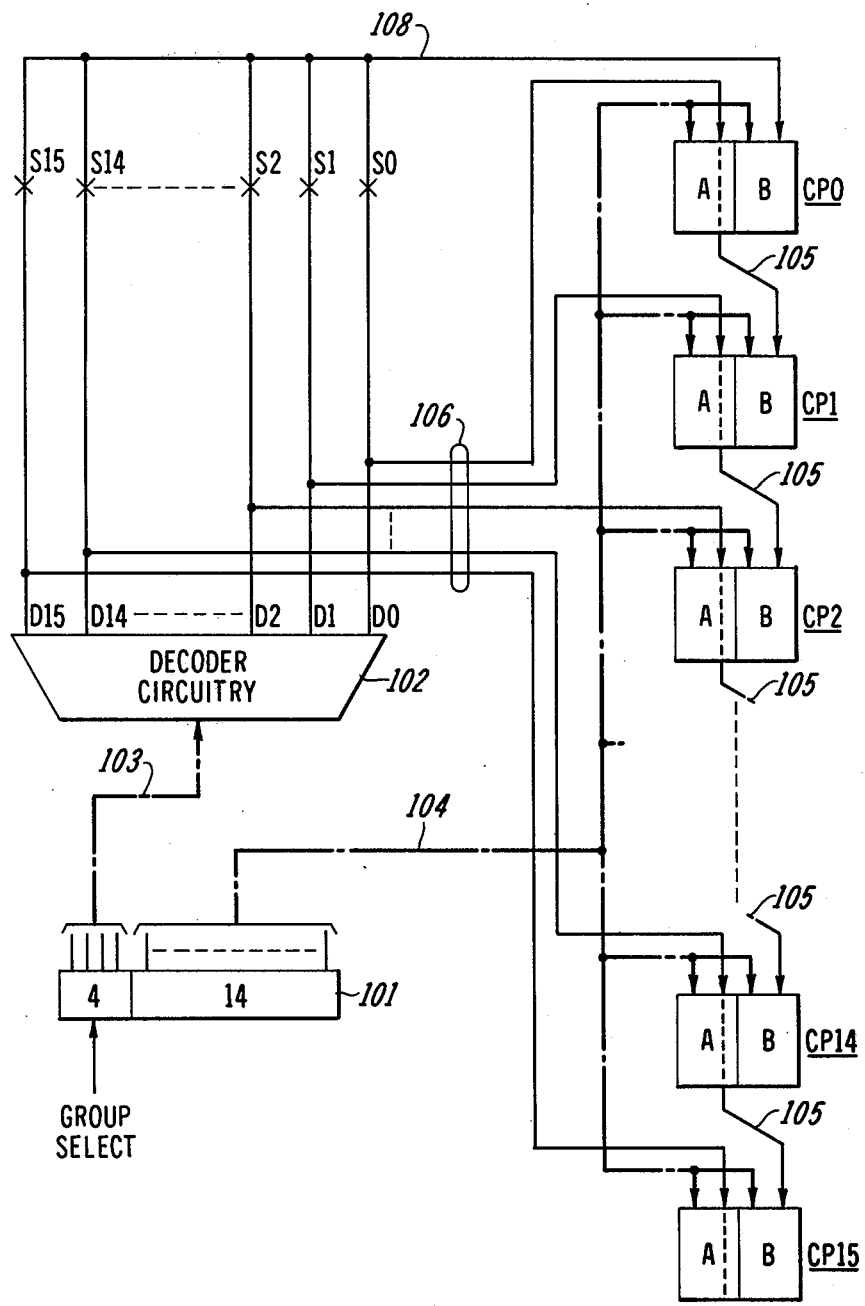
FIG. 1 is a block diagram of a memory system arranged in accordance with our invention wherein each circuit pack comprises two memory modules.

FIG. 1 illustrates a memory system having a maximum capacity of 256 K ($256 \times 1024$) words arranged in accordance with our invention. The number of bits in a memory word is immaterial and, thus, not defined herein. The memory is addressed via the address register 101. The high-order 4 bits of the address register 101 are provided to the decoder circuitry 102 via the conductors 103. The decoder circuitry 102 decodes these 4 address bits to select 1 of the 16 circuit packs CP0 through CP15. The remaining 14 bits of the 18-bit address (18 bits being required to address the 246 K memory words) are provided directly to the circuit packs via the conductors 104.

Each of the circuit packs CP0 through CP15 comprises two individually accessible memory modules, memory module A and memory module B. Each memory module has the capacity to store 16 K ($16 \times 1024$) memory half words. The A memory module of each of the circuit packs CP0 through CP15 is associated with the B memory module of another circuit pack via the conductors 105 and the switches S0 through S15 to form groups of memory modules wherein each group comprises an A memory module and a B memory module.

The outputs D0 through D15 of the decoder circuitry 102 are connected respectively to the A modules of the circuit packs CP0 through CP15 via the conductors 106. If the memory system is partially equipped, i.e., comprises less than 16 circuit packs, the circuit packs initially provided are the low-numbered packs with additional packs added in order of increasing circuit pack numbers. In a partially equipped memory, the decoder output signals are extended by each A memory module present in the memory (with the exception of the A module of the highest-numbered circuit pack present) to its associated B memory module via the conductors 105. The A module of the highest-numbered circuit pack present is associated with the B module of the circuit pack CP0 via the switches S0 through S15 and the conductor 108.

Accordingly, if the three circuit packs CP0 through CP2 are provided in the memory, the S2 switch is closed and the switches S0, S1, and S3 through S15 are open such that the A memory module of CP2 is associated with the B memory module of CP0. If the memory is to be expanded by 16 K ($16 \times 1024$) memory words, a fourth circuit pack CP3 is added to the memory, switch S2 is opened and switch S3 is closed to associate the A memory module of the new circuit pack CP3 with the B memory module of the circuit pack CP0. The A module of the circuit pack CP2 is associated with the B module of the circuit pack CP3 via the conductors 105. In this way, the memory can be expanded by the addition of a single circuit pack (or a number of circuit packs) up to the maximum memory capacity of 16 circuit packs. With this memory arrangement, the number of active devices on any given circuit pack for a memory read or write operation is divided by two; the corresponding power dissipated is distributed over the corresponding two circuit packs which contain the A module and the B module which are accessed; and the minimum memory growth unit is maintained at a single circuit pack or, in the case of the illustrative embodiment, 16 K words.

Figure 2:
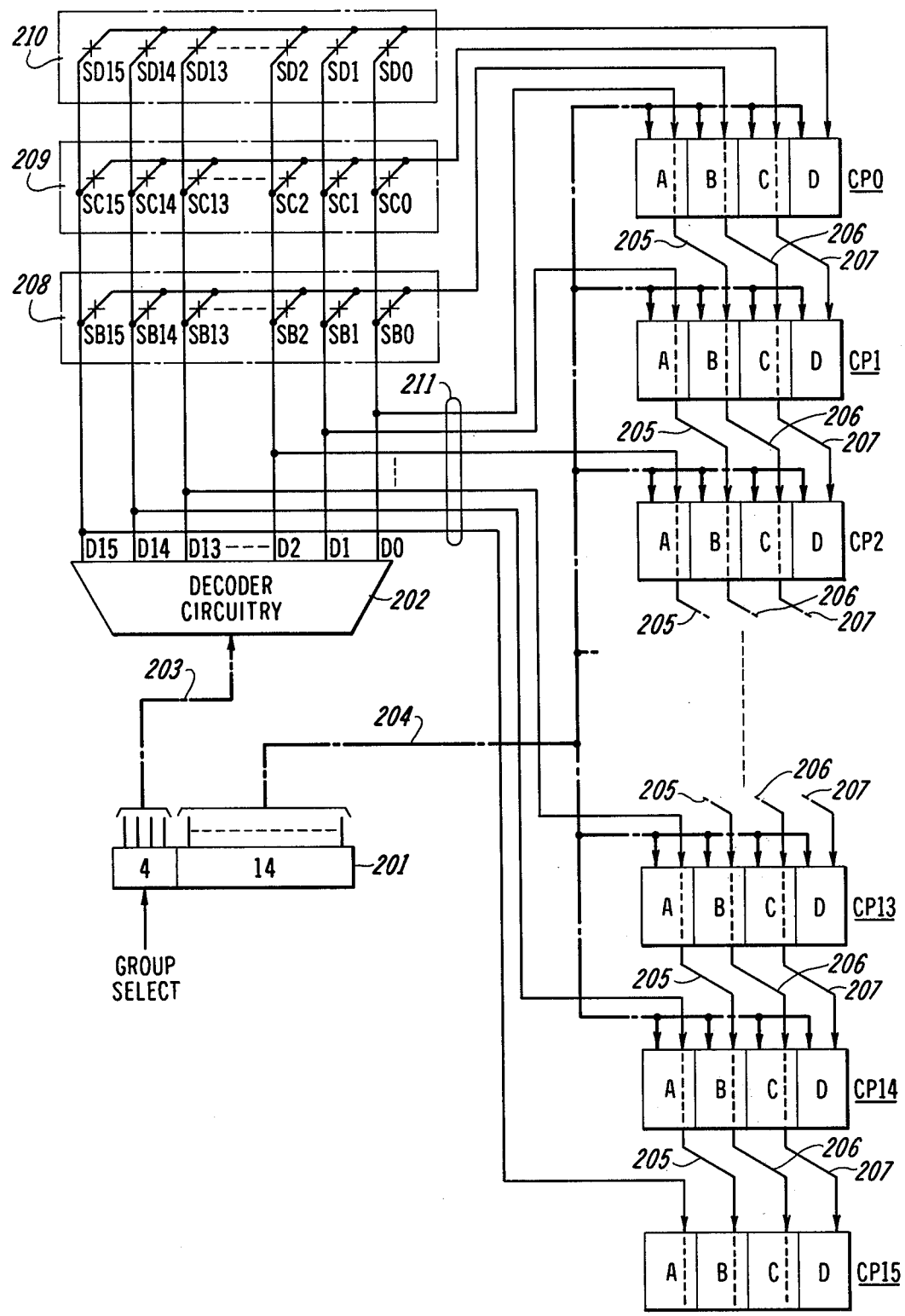
FIG. 2 is a block diagram of a memory system arrangement wherein each circuit pack comprises four memory modules.

FIG. 2 is a memory system arrangement wherein each circuit pack comprises four independently accessible memory modules and each memory module comprises 16 K word segments each of which comprises one-quarter of a memory word. The arrangement of FIG. 2 extends the principles established in FIG. 1 and from these examples it can be readily seen that this invention may be practiced in other arrangements wherein each circuit pack contains an arbitrary number of modules with each module providing storage for corresponding fractional portions of memory words other than one-half or one-fourth. In FIG. 2, an address is provided to the memory system via the address register 201. The high-order 4 bits of the address are provided to the decoder circuitry 202 via the conductors 203 to select 1 of the 16 circuit oacks CP0 through CP15. The remaining 14 address bits are provided directly to the circuit packs CP0 through CP15 via the conductors 204.

Each of the circuit packs CP0 through CP15 comprises four individually accessiby memory modules A, B, C, and D. Each memory module has the capacity to store 16 K (16×1024) memory quarter words. The A memory module of each circuit pack is associated with: the B memory module of a second circuit pack; the C memory module of a third circuit pack; and the D memory module of a fourth circuit pack. These associations are established by the conductors 205, 206, 207 and the switch groups 208, 209, and 210. Accordingly, groups of memory modules are formed wherein each group comprises an A memory module, a B memory module, a C memory module, and a D memory module. Memory words are written into and read from these groups with quarter word segments of each word written or read simultaneously from the four memory modules comprising a group. Since these four memory modules are on four separate circuit packs, the number of active devices on any one circuit pack is divided by four.

The outputs D0 through D15 of the decoder circuitry 202 are connected respectively to the A modules of the circuit packs CP0 through CP15 via the conductors 211. With the exception of the highest-numbered equipped circuit pack, the decoder output signals are extended through each A memory module to an associated B memory module via the conductors 206; each B memory module extends the decoder output signals to an associated C memory module via the conductors 206; and each C memory module extends the decoder output signals to an associated D memory module via the conductors 207. The extension of the decoder output signals from the highest-numbered equipped circuit pack to the circuit pack CP0 is effected via the switch groups 208, 209, and 210. For example, if the memory is fully equipped with the 16 circuit packs CP0 through CP15, the switches SB15, SC14, and SD13 would be closed while all the other switches of the switch groups 208, 209, and 210 would be open. Accordingly, the A memory module of CP15 would be associated with the B memory module of CP0, the B memory module of CP15 would be associated with memory module C of CP0, and the C memory module of CP15 would be associated with the D memory module of CP0. For a memory comprising a single circuit pack CP0, the switches SB0, SC0, and SD0 would be closed and the remaining switches of th switch groups 208, 209, and 210 would be open. For this particular configuration, all memory words would be stored on a single circuit pack with the resultant concentration of power dissipation on that circuit pack. However, since the memory is physically large enough to contain 16 circuit packs, the added space in the physical enclosure for the circuit pack CP0 would provide sufficient heat removal so that the circuit pack does not overheat. For a memory comprising two circuit packs CP0 and CP1, the A and C memory modules of each pack would be associated with the B and D memory modules of the other circuit pack; switches SB1, SC0, and SD1 would be closed while the remaining switches of the switch groups 208, 209, and 210 would be open. For a memory containing three or more circuit packs, the switches of the switch groups 208, 209, and 210 would be closed according to the following algorithm: the SB switch corresponding to the number of the highest-numbered circuit pack equipped in the memory would be closed; the SC switch corresponding to the highest-numbered circuit pack in the memory minus 1 would be closed; and the SD switch corresponding to the highest-numbered circuit pack equipped in the memory minus 2 would be closed. Accordingly, for a memory comprising three circuit packs, the highest-numbered circuit pack is CP2 and the switches SB2, SC1, and SD0 are closed while the remaining switches of the switch groups 208, 209, and 210 are open. Each time that a memory is expanded by adding one or more circuit packs, the appropriate switches would be closed in the switch groups 208, 209, and 210 and the switches previously closed would be opened. This provides for spreading the power dissipation over four boards (or among the number of boards provided) while allowing memory growth in single circuit pack increments. It is noted that certain switches of the switch groups 208, 209, and 210 can be eliminated if a minimum-sized memory were defined, e.g., if a 4-board memory was defined as the minimum size available the SB0, SB1, and SB2 switches, the SC0 and SC1 switches and the SD0 switch can be eliminated. For larger minimum memory sizes, more switches can be eliminated.

What is claimed is:

1. A word organized random access memory system wherein each word comprises n bits wherein n is an integer greater than 1, the system comprising:
 a pluality of word segment organized random access memory modules wherein each word segment comprises n/x bits wherein x is an integer greater than 1 such that n/x is an integer;
 a plurality of circuit packs which each contains x individually accessible memory modules and no two memory modules of a circuit pack contain corresponding word segments; and
 linkage means for interconnecting said memory modules to form a plurality of groups wherein each group comprises x memory modules and no two memory modules of a circuit pack are members of the same group of said plurality of groups.

2. A memory system in accordance with claim 7 further comprising:
means for storing word address signals; and
means for decoding portions of said address signals for selecting the group in which an addressed word is stored.

3. A memory system in accordance with claim 1 wherein said linkage means comprises a plurality of switches and conductors for selectively interconnecting said memory modules to form predetermined groups as required by the number of circuit packs present in said memory system.

4. A memory system in accordance with claim 1 wherein n=16 and x=2.

5. A memory system in accordance with claim 1 wherein n=16 and x=4.

6. A word organized random access memory wherein each memory location can store an n bit word wherein n is an integer greater than 1, the memory comprising:
a plurality of circuit packs each comprising two or more individually accessible memory modules arranged to store corresponding word segments of a plurality of memory words and no two memory modules of a circuit pack contain corresponding word segments, wherein each word segment corresponds in bit capacity to $$\frac{n \text{ bits}}{\text{number of memory modules per circuit pack}};$$

and
means for interconnecting the control of said memory modules into groups of modules which define memory word locations such that no two memory modules of a group are on the same circuit pack.

7. A word organized random access memory wherein each memory location can store an n bit word wherein n is an integer greater thab 1, said memory comprising:
a plurality of circuit packs each comprising two or more individually accessible memory modules arranged to store corresponding word segments of a plurality of memory words, said word segments corresponding in bit capacity to $$\frac{n \text{ bits}}{\text{number of memory modules per circuit pack}};$$

and
means for interconnecting said circuit packs into a chain which is looped back onto itself to form a a re-entrance loop.

8. A word organized random access memory system wherein each word comprises n bits wherein n is an integer greater than 1, the system comprising:
a plurality of circuit packs, each of said circuit packs including x word segment organized random access memory modules and each word segment comprising n/x bits wherein x is an integer greater than 1 such that n/x is an integer;
decoder means for accessing the first memory module of each of said circuit packs; and
means including said decoder mweans and switch means for connecting said memory modules into interleaved links of a chain of interconnected circuit packs wherein each link comprises a group of memory modules and no two memory modules of the same circuit pack are included in the same link and such that incomplete groups from the end of the chain are connected back to complementary incomplete groups at the beginning of the chain to form a closed chain structure.

9. A memory in accordance with claim 7 wherein said interconnecting means comprises patterned wiring and a plurality of switches.

* * * * *

UNITED STATES PATENT AND TRADEMARK OFFICE
CERTIFICATE OF CORRECTION

PATENT NO. : 4,164,041

DATED : August 7, 1979

INVENTOR(S) : Walter Thornley Hartwell, David Leary Hinshaw, Charles William Hoffner II, Wing Noon Toy It is certified that error appears in the above-identified patent and that said Letters Patent are hereby corrected as shown below:

Column 5, line 4, "claim 7" should read --claim 1--. Column 6, line 3, "thab" should read --than--; line 27 after decoder, "mweans" should read --means--.

Signed and Sealed this

Fourteenth Day of October 1980

[SEAL]

Attest:

SIDNEY A. DIAMOND

Attesting Officer  Commissioner of Patents and Trademarks